United States Patent
Jo

(10) Patent No.: US 11,780,732 B2
(45) Date of Patent: Oct. 10, 2023

(54) CARBONATED TANTALUM COATING MATERIAL

(71) Applicant: TOKAI CARBON KOREA CO., LTD., Gyeonggi-do (KR)

(72) Inventor: Dong Wan Jo, Gyeonggi-do (KR)

(73) Assignee: TOKAI CARBON KOREA CO., LTD., Gyeonggi-Do (KR)

( * ) Notice: Subject to any disclaimer, the term of this patent is extended or adjusted under 35 U.S.C. 154(b) by 502 days.

(21) Appl. No.: 16/717,525

(22) Filed: Dec. 17, 2019

(65) Prior Publication Data

US 2020/0207629 A1 Jul. 2, 2020

(30) Foreign Application Priority Data

Dec. 17, 2018 (KR) .................. 10-2018-0163541

(51) Int. Cl.
| | | |
|---|---|---|
| *C01B 32/914* | (2017.01) | |
| *C01B 32/156* | (2017.01) | |
| *C01B 32/194* | (2017.01) | |
| *C01B 32/21* | (2017.01) | |
| *C23C 16/32* | (2006.01) | |

(52) U.S. Cl.
CPC .......... *C01B 32/914* (2017.08); *C01B 32/156* (2017.08); *C01B 32/194* (2017.08); *C01B 32/21* (2017.08); *C01P 2006/32* (2013.01); *C23C 16/32* (2013.01)

(58) Field of Classification Search
CPC ... C01B 32/914; C01B 32/156; C01B 32/194; C01B 32/21; C01P 2006/32; C23C 16/32; C04B 41/009; C04B 41/5057; C04B 41/87; C04B 35/62222; C04B 35/522; C04B 35/5607; C04B 2235/94; C04B 2235/9607; C04B 2235/963
See application file for complete search history.

(56) References Cited

U.S. PATENT DOCUMENTS

| | | | |
|---|---|---|---|
| 9,322,113 B2 * | 4/2016 | Kondo | ............... C04B 41/87 |
| 10,522,386 B2 | 12/2019 | Shinohara et al. | |
| 2012/0040172 A1 | 2/2012 | Fujiwara et al. | |

FOREIGN PATENT DOCUMENTS

| | | |
|---|---|---|
| CN | 1942415 A | 4/2007 |
| CN | 101445392 A | 6/2009 |
| CN | 105839070 A | 8/2016 |
| EP | 1852407 A | 7/2007 |
| JP | H10245285 A | 9/1998 |

(Continued)

OTHER PUBLICATIONS

Nakamura Daisuke et al: "Sintered tantalum carbide coatings on graphite substrates: Highly reliable protective coatings for bulk and epitaxial growth", Feb. 23, 2015, 5 pages.

(Continued)

*Primary Examiner* — Richard M Rump
(74) *Attorney, Agent, or Firm* — Armstrong Teasdale LLP

(57) ABSTRACT

The present disclosure relates to a tantalum carbide coating material, and more specifically, to a tantalum carbide coating material comprising: a carbon substrate; and a tantalum carbide coating formed on the carbon substrate, wherein a thermal expansion coefficient difference between the carbon substrate and the tantalum carbide coating is $1.0 \times 10^{-6}/°C$. or more.

3 Claims, 2 Drawing Sheets

(56) References Cited

FOREIGN PATENT DOCUMENTS

| | | |
|---|---|---|
| JP | 2004084057 A | 2/2003 |
| JP | 2007527108 A | 9/2007 |
| JP | 2007308370 A | 11/2007 |
| JP | 2011153378 A | 12/2010 |
| JP | 2011153070 A | 8/2011 |
| JP | 2016008319 A | 1/2016 |
| TW | 201815673 A | 5/2018 |
| TW | 201819667 A | 6/2018 |
| WO | 2004009515 A1 | 1/2004 |

OTHER PUBLICATIONS

Zhang, Ping. "Thermal Spray Material", National Defense Press, Beijing.

Hao et al. "Thermal Spray Science and Technology," Metallurgical Industry Press, 2013.

\* cited by examiner

CARBONATED TANTALUM COATING MATERIAL

CROSS-REFERENCE TO RELATED APPLICATION(S)

This application claims the benefit of Korean Patent Application No 10-2018-0163541, filed on Dec. 17, 2018, in the Korean Intellectual Property Office, the disclosure of which is incorporated herein by reference.

BACKGROUND

1. Field of the Invention

The present disclosure relates to a tantalum carbide coating material.

2. Description of the Related Art

A problem that original function required in the carbon material cannot be performed occurs when the carbon material is not frequently replaced as a carbon material exposed to an atmosphere of a reducing gas such as nitrogen gas, ammonia gas or the like in a high temperature environment is deteriorated or damaged by a reaction with the reducing gas.

For example, there is a problem that consumption of the product made of the carbon material is progressed in a short time when a product made of the carbon material is disposed in a furnace, and the inside of the furnace is heated to about 1,200° C. while forming an ammonia atmosphere by introducing an ammonia gas into the furnace.

As a tantalum carbide composite having tantalum carbide coated on the surface of the carbon material is used to solve such a lifetime problem, the tantalum carbide composite has been used in a state that a carbon base material having a thermal expansion coefficient similar to that of tantalum carbide is applied to the tantalum carbide composite so as to prevent stress reduction of a carbon substrate and tantalum carbide and exfoliation of a coating layer.

However, as types of a carbon substrate having a thermal expansion coefficient similar to that of tantalum carbide are limited, there is a problem that the carbon substrate having a thermal expansion coefficient similar to that of tantalum carbide is applied to a tantalum carbide coating material. Further, although the carbon substrate having a thermal expansion coefficient similar to that of tantalum carbide is applied to the tantalum carbide coating material, problems including stress generation, bending and others may occur.

SUMMARY

In order to solve the above-mentioned problems, the purpose of the present disclosure is to provide a tantalum carbide coating material in which problems including stress reduction, bending, exfoliation and others of a tantalum carbide coating layer and a carbon substrate have been solved.

However, an object to be accomplished by the present disclosure is not limited to the above-mentioned object, and other objects not mentioned will be understood by those skilled in the art from the following description.

A tantalum carbide coating material according to an embodiment of the present disclosure includes: a carbon substrate; and a tantalum carbide coating formed on the carbon substrate, wherein a thermal expansion coefficient difference between the carbon substrate and the tantalum carbide coating is $1.0 \times 10^{-6}/°$ C. or more.

According to an aspect, a thermal expansion coefficient difference between the carbon substrate and the tantalum carbide coating may be $1.5 \times 10^{-6}/°$ C. or more.

According to an aspect, a thermal expansion coefficient difference between the carbon substrate and the tantalum carbide coating may be $2.0 \times 10^{-6}/°$ C. or more.

According to an aspect, the carbon substrate may have a thermal expansion coefficient of $4.0 \times 10^{-6}/°$ C. to $6.0 \times 10^{-6}/°$ C.

According to an aspect, the tantalum carbide coating may have a thermal expansion coefficient of $7.0 \times 10^{-6}/°$ C. to $7.8 \times 10^{-6}/°$ C.

According to an aspect, the carbon substrate may include at least one selected from the group consisting of graphene, graphite, and fullerene.

According to an aspect, the tantalum carbide coating may include a crack having a width of 0.1 μm to 1.5 μm.

According to an aspect, the tantalum carbide coating material may be bent to 20 μm or less.

A tantalum carbide coating material according to the present disclosure reduces stress by generating a microcrack in a tantalum carbide coating layer due to a thermal expansion coefficient difference between the carbon substrate and the tantalum carbide coating, and can minimize exfoliation or bending generated in the tantalum carbide coating material accordingly.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
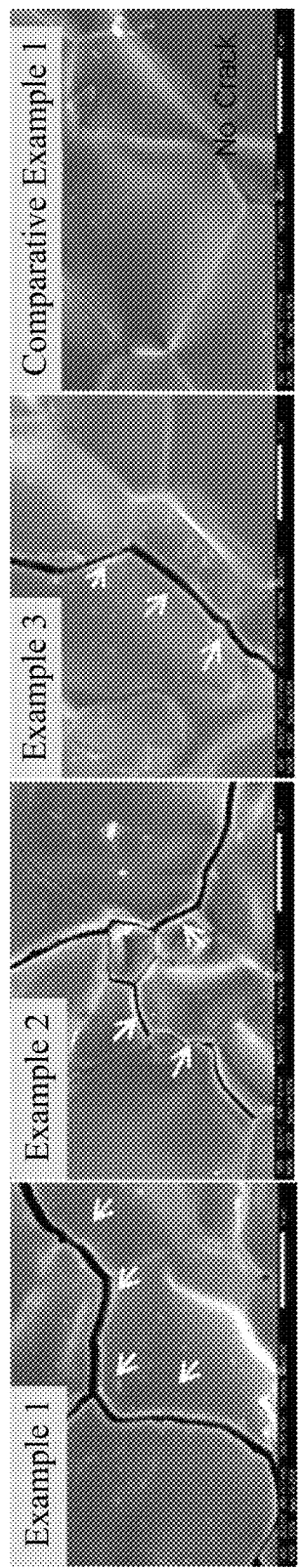
FIG. 1 is images for confirming whether or not cracks are generated in tantalum carbide coating materials manufactured through Examples and Comparative Example of the present disclosure.

Hereinafter, embodiments of the present disclosure will be described in detail with reference to the accompanying drawings. In the description of the present disclosure, if detailed descriptions of related disclosed art or configuration are determined to unnecessarily make the gist of the present disclosure obscure, they will be omitted. Also, terms used in the present specification are used so as to appropriately describe embodiments of the present disclosure and thus may be changed depending on the user's or operator's intention or the practices of the art to which the present disclosure pertains. Therefore, definitions of the terms should be made on the basis of the overall context of the present specification. The same reference numerals as shown in each drawing represent same elements.

In the whole present specification, when any member is positioned "on" the other member, this not only includes a case that the any member is brought into contact with the other member, but also includes a case that another member exists between two members.

In the whole present specification, if a prescribed part "includes" a prescribed element, this means that another element can be further included instead of excluding other elements unless any particularly opposite description exists.

Hereinafter, a tantalum carbide coating material according to the present disclosure will be described in detail with reference to embodiments and drawings. However, the present disclosure is not limited to such embodiments and drawings.

A tantalum carbide coating material according to an embodiment of the present disclosure includes: a carbon substrate; and a tantalum carbide coating formed on the carbon substrate, wherein a thermal expansion coefficient difference between the carbon substrate and the tantalum carbide coating is $1.0 \times 10^{-6}/°$ C. or more.

A tantalum carbide coating material according to the present disclosure reduces stress by generating a microcrack in a tantalum carbide coating layer due to a thermal expansion coefficient difference between the carbon substrate and the tantalum carbide coating, and can minimize exfoliation or bending generated in the tantalum carbide coating material accordingly.

According to an aspect, the tantalum carbide coating may include a crack having a width of 0.1 µm to 1.5 µm.

In general, the carbon substrate is used in a state that tantalum carbide is coated on the carbon substrate so as to protect a carbon substrate. When a carbon substrate having a lower thermal expansion coefficient than tantalum carbide is applied, a crack having a micro-sized width is generated in a tantalum carbide coating layer.

Since a gap between the tantalum carbide coating layers caused by the crack is expanded again at high temperatures, a process gas does not exert influence on lifetime of the carbon substrate, and can rather realize an effect of relieving stress when a thermal expansion coefficient difference between the carbon substrate and the tantalum carbide coating is $1.0 \times 10^{-6}/°$ C. or more.

According to an aspect, a thermal expansion coefficient difference between the carbon substrate and the tantalum carbide coating may be $1.5 \times 10^{-6}/°$ C. or more.

When the thermal expansion coefficient difference between the carbon substrate and the tantalum carbide coating is $1.5 \times 10^{-6}/°$ C. or more, a tantalum carbide coating material which is bent to 15 µm or less can be realized.

According to an aspect, a thermal expansion coefficient difference between the carbon substrate and the tantalum carbide coating may be $2.0 \times 10^{-6}/°$ C. or more.

When the thermal expansion coefficient difference between the carbon substrate and the tantalum carbide coating is $2.0 \times 10^{-6}/°$ C. or more, a tantalum carbide coating material which is bent to 20 µm or less can be realized.

According to an aspect, the carbon substrate may have a thermal expansion coefficient of $4.0 \times 10^{-6}/°$ C. to $6.0 \times 10^{-6}/°$ C.

According to an aspect, the tantalum carbide coating may have a thermal expansion coefficient of $7.0 \times 10^{-6}/°$ C. to $7.8 \times 10^{-6}/°$ C.

Namely, a tantalum carbide coating material which has excellent lifetime characteristics and exfoliating properties at the same time and of which bending is minimized in a high-temperature gas process by applying a general carbon substrate and a general tantalum carbide coating can be realized.

According to an aspect, the carbon substrate may include at least one selected from the group consisting of graphene, graphite, and fullerene.

According to an aspect, the tantalum carbide coating material may be bent to 20 µm or less.

As a tantalum carbide coating material according to the present disclosure having a microcrack caused by a thermal expansion coefficient difference is expanded again at a high temperature condition, a process gas does not deform or damage a carbon substrate, and a stress-relieved tantalum carbide coating material can be realized at the same time.

Hereinafter, the present disclosure will be described in more detail through Examples and Comparative Example.

However, the following Examples merely illustrate the present disclosure, and it should not be interpreted that the scope of the present disclosure is limited to the following Examples.

Examples

Tantalum carbide coating materials (hereinafter referred to as 'Example 1', 'Example 2' and 'Example 3' respectively) were manufactured by forming a tantalum carbide coating having a thermal expansion coefficient of $7.0 \times 10^{-6}/°$ C. to $7.8 \times 10^{-6}/°$ C. on graphite substrates having thermal expansion coefficients of $4.15 \times 10^{-6}/°$ C. to $5.09 \times 10^{-6}/°$ C. and $6.0 \times 10^{-6}/°$ C. respectively.

Comparative Example

A tantalum carbide coating material (hereinafter referred to as 'Comparative Example 1') was manufactured by forming a tantalum carbide coating having a thermal expansion coefficient of $7.0 \times 10^{-6}/°$ C. to $7.8 \times 10^{-6}/°$ C. on a graphite substrate having a thermal expansion coefficient of $7.8 \times 10^{-6}/°$ C.

The following Table 1 is a table showing thermal expansion coefficients of tantalum carbide coating materials manufactured through Examples and Comparative Example of the present disclosure. The relevant thermal expansion coefficients are data measured from room temperature to 1,000° C. by dilatometry (DIL 402C).

TABLE 1

| | Graphite (substrate) | | | | Tantalum carbide coating |
|---|---|---|---|---|---|
| | Example 1 | Example 2 | Example 3 | Comparative Example 1 | |
| Thermal expansion coefficient ($10^{-6}/°$ C.) | 4.15 | 5.09 | 6.0 | 7.8 | 7 to 7.8 |

After processing graphite substrates having different thermal expansion coefficients to a size of ø150×5 t and coating the processed graphite substrates with tantalum carbide, crack phenomena and bending degrees of the tantalum carbide-coated graphite substrates were compared.

FIG. 1 is images for confirming whether or not cracks are generated in tantalum carbide coating materials manufactured through Examples and Comparative Example of the present disclosure.

Referring to FIG. 1, it can be seen that a crack with a micro-sized width is generated in a tantalum carbide coating layer of Examples 1 to 3 to which a graphite substrate having a lower thermal expansion coefficient than that of tantalum carbide is applied. Meanwhile, it can be seen that a crack is not generated in a tantalum carbide coating layer of Comparative Example 1 to which a graphite substrate having a thermal expansion coefficient similar to that of tantalum carbide is applied.

The following Table 2 is a table showing width of a microcrack of tantalum carbide coating materials manufactured through Examples and Comparative Example of the present disclosure.

TABLE 2

| Width of microcrack (μm) | | | |
|---|---|---|---|
| Example 1 | Example 2 | Example 3 | Comparative Example 1 |
| 0.91 | 0.59 | 0.53 | — |

Figure 2:
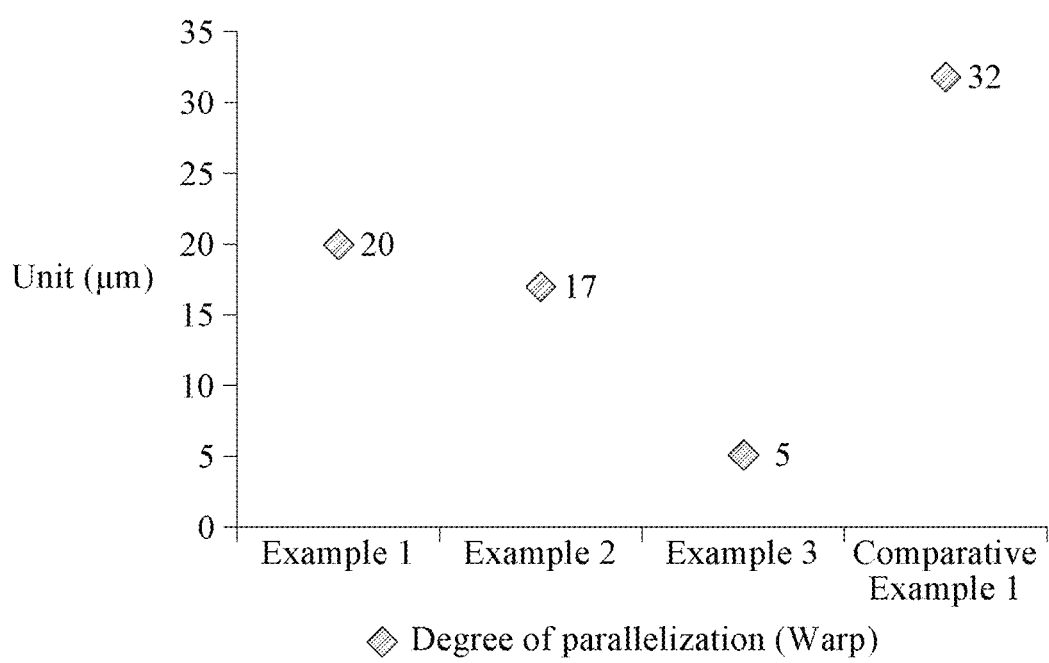
FIG. 2 is a graph of showing bending tendencies for each graphite material of the tantalum carbide coating materials manufactured through Examples and Comparative Example of the present disclosure.

FIG. 2 is a graph of showing bending tendencies for each graphite material of the tantalum carbide coating materials manufactured through Examples and Comparative Example of the present disclosure. Specifically, numerical values of FIG. 2 are bending values measured from tantalum carbide-coated materials by a coordinate measuring machine (CMM) (measuring machine capable of measuring dimensions, geometric deviation and shape precision of a three-dimensional shape).

Referring to FIG. 2, it can be seen that bending values of tantalum carbide coating materials of Example 1 and Example 2 to which a graphite substrate having a low thermal expansion coefficient is applied are also lower levels than bending value of a tantalum carbide coating material of Comparative Example 1 to which a graphite substrate having a thermal expansion coefficient similar to that of tantalum carbide is applied. Namely, tantalum carbide coating materials having low bending values can be realized even though a graphite substrate having a high thermal expansion coefficient is not applied to the tantalum carbide coating materials.

Meanwhile, it can be seen that bending is generated very little from a tantalum carbide coating material of Example 3 having a thermal expansion coefficient difference between graphene and the tantalum carbide coating of a $1.0 \times 10^{-6}/°$ C. level.

Although the above-mentioned Examples have been described by limited Examples and drawings, those skilled in the art may apply various modifications and alterations from the above-mentioned description. For example, appropriate results can be achieved although described techniques are carried out in a different order from a described method, and/or described elements are combined or mixed in a different form from the described method, or replaced or substituted with other elements or equivalents. Therefore, other embodiments, other Examples, and equivalents to patent claims belong to the scope of the patent claims to be described later.

What is claimed is:

1. A tantalum carbide coating material comprising:
   a carbon substrate; and
   a tantalum carbide coating formed on the carbon substrate,
   wherein the tantalum carbide coating includes a crack having a width of 0.1 μm to 1.5 μm;
   wherein a thermal expansion coefficient difference between the carbon substrate and the tantalum carbide coating is greater than $2.0 \times 10^{-6}/°$ C.; and
   wherein the tantalum carbide coating material is bent to 5 μm or greater and 20 μm or less.

2. The tantalum carbide coating material of claim 1, wherein the tantalum carbide coating has a thermal expansion coefficient of $7.0 \times 10^{-6}/°$ C. to $7.8 \times 10^{-6}/°$ C.

3. The tantalum carbide coating material of claim 1, wherein the carbon substrate includes at least one selected from the group consisting of graphene, graphite, and fullerene.

* * * * *